(12) United States Patent
Cox et al.

(10) Patent No.: US 7,327,437 B2
(45) Date of Patent: Feb. 5, 2008

(54) LITHOGRAPHIC APPARATUS AND DEVICE MANUFACTURING METHOD

(75) Inventors: Henrikus Herman Marie Cox, Eindhoven (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 330 days.

(21) Appl. No.: 11/005,480

(22) Filed: Dec. 7, 2004

(65) Prior Publication Data

US 2006/0119829 A1 Jun. 8, 2006

(51) Int. Cl.
*G03B 27/42* (2006.01)
*G03B 27/58* (2006.01)
(52) U.S. Cl. .................. 355/53; 355/72; 355/75; 378/34; 250/492.2
(58) Field of Classification Search .......... 355/53, 355/72, 75; 310/10, 12; 318/649
See application file for complete search history.

(56) References Cited

U.S. PATENT DOCUMENTS

| | | | | |
|---|---|---|---|---|
| 6,025,688 A | * | 2/2000 | Sekiguchi | 318/610 |
| 6,472,840 B1 | * | 10/2002 | Takahashi | 318/649 |
| 2002/0140921 A1 | * | 10/2002 | Morisada | 355/73 |
| 2003/0071981 A1 | * | 4/2003 | Ueta | 355/72 |
| 2003/0098962 A1 | * | 5/2003 | Kubo | 355/72 |
| 2003/0098966 A1 | * | 5/2003 | Korenaga et al. | 355/75 |
| 2003/0147062 A1 | * | 8/2003 | Morisada | 355/72 |
| 2003/0156270 A1 | * | 8/2003 | Hunter | 355/72 |
| 2003/0179359 A1 | * | 9/2003 | Korenaga | 355/75 |
| 2004/0066497 A1 | * | 4/2004 | Koide | 355/53 |
| 2004/0239910 A1 | * | 12/2004 | Ukaji | 355/72 |

* cited by examiner

*Primary Examiner*—D. Rutledge
(74) *Attorney, Agent, or Firm*—Pillsbury Winthrop Shaw Pittman LLP

(57) ABSTRACT

A lithographic apparatus includes an illumination system configured to condition a radiation beam, a patterning device support constructed to support a patterning device being capable of imparting the radiation beam with a pattern in its cross-section to form a patterned radiation beam, a substrate support constructed to hold a substrate, and a projection system configured to project the patterned radiation beam onto a target portion of the substrate. An actuator assembly is configured to move one of the supports with six degrees of freedom comprising x, y, z, rx, ry and rz directions. A controller controls the actuator assembly, and includes at least one compensator which is designed to dynamically decouple a dynamics of the actuator assembly in the degrees of freedom.

27 Claims, 7 Drawing Sheets

$$H_{comp}(f) = (H_{mech}(f))^{-1} * H_{desired}(f)$$

$H_{comp}(f)$ $H_{mech}(f)$ ... $^{-1}$ $H_{desired}(f)$

×

=

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The throughput of a lithographic apparatus, measured in substrates (wafers) processed per unit of time, depends, inter alia, from the velocity, acceleration and jerk with which movable parts of the lithographic apparatus may be displaced by servo motors, and the settling time of these movable parts, where the settling time is the total elapsed time just after completing a position or velocity setpoint until the servo error is within a required position and/or velocity accuracy window. Examples of devices comprised in a lithographic apparatus and having such movable parts are substrate handling devices and reticle handling devices. A displacement of the movable, parts generally is considered to take place substantially in x and y directions while irradiating target portions of a substrate.

An increase of the throughput may be obtained by increasing the force generated by an actuator assembly driving a movable part so as to increase the acceleration, and by reducing the weight of the movable part as much as possible. A suitable structure of a movable part having a low weight is a plate-like structure supported by ribs. During high acceleration such a structure, however, may be susceptible to internal structural elastic deformation, resulting in an unacceptable cross-talk between different degrees of freedom that are controlled. Thus, with a deformation during high acceleration, a large position error may occur that takes a long settling time, and thus resulting in a loss of potential throughput (e.g. measured in wafers/hour).

In general terms, a lithographic stage or servo positioning performance is expressed as a time Moving Average error (MA error) and a time Moving Standard Deviation (MSD) of the error. A critical time window here is the time interval that each point on a die is exposed (in other words: receives photons). If the average position error for a point on the die during this time interval is high (in other words: high MA-error), the effect is a shift of the exposed image, resulting in overlay errors. If the standard deviation of the position error during this time interval is high (in other words: high MSD error), the image may smear, resulting in fading errors.

SUMMARY

It is desirable to provide an apparatus and method in which a deformation of a movable part during acceleration may be limited or avoided.

According to an embodiment of the invention, there is provided a lithographic apparatus including an illumination system configured to condition a radiation beam; a support structure constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, an actuator assembly configured to move one of the support structure and the substrate table with six degrees of freedom including x, y, z, rx, ry and rz directions, and a controller being configured to control the actuator assembly, the controller including at least one compensator designed to dynamically decouple the actuator assembly dynamics in those degrees of freedom.

According to an embodiment of the invention, the compensator has a control function obtained by a multiplication of a plurality of desired transfer functions to dynamically decouple the actuator assembly dynamics, and a plurality of inverted transfer functions of the mechanical behavior of a combination of the actuator assembly and one of the support structure and the substrate table.

According to an embodiment of the invention, the compensator is included in a feedback path of the controller, and the compensator has a control function according to an array of Bode plots descriptive of transfer functions coupling a plurality of controller force inputs and controller torque inputs to a plurality of output motor feedback forces and output motor feedback torques.

According to an embodiment of the invention, the compensator is included in a feedforward path of the controller, and the compensator has a control function according to an array of Bode plots descriptive of transfer functions coupling a plurality of controller setpoint position-derived force inputs and controller setpoint position-derived torque inputs to a plurality of output motor feedforward forces and output motor feedforward torques. Here, the term position-derived includes: relating to the position, velocity, acceleration, jerk, or snap.

A lithographic apparatus in accordance with an embodiment of the invention, includes an illumination system configured to condition a radiation beam; a patterning device support constructed to support a patterning device, the patterning device being capable of imparting the radiation beam with a pattern in its cross-section to form a patterned radiation beam; a substrate support constructed to hold a substrate; a projection system configured to project the patterned radiation beam onto a target portion of the substrate, an actuator assembly configured to move one of the supports with six degrees of freedom comprising x, y, z, rx, ry and rz directions, and a controller configured to control the actuator assembly, the controller including at least one compensator configured to dynamically decouple a dynamics of the actuator assembly in the degrees of freedom.

A device manufacturing method in accordance with another embodiment of the invention includes patterning a beam of radiation with a patterning device to form a patterned beam of radiation, the patterning device being supported by a patterning device support; projecting the patterned radiation beam onto a target portion of a substrate, the substrate being supported by a substrate support, moving one of the supports with an actuator assembly, the actuator assembly being configured to move the one support with six degrees of freedom including x, y, z, rx, ry and rz directions, and controlling the actuator assembly by dynamically decoupling a dynamics of the actuator assembly in the degrees of freedom.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
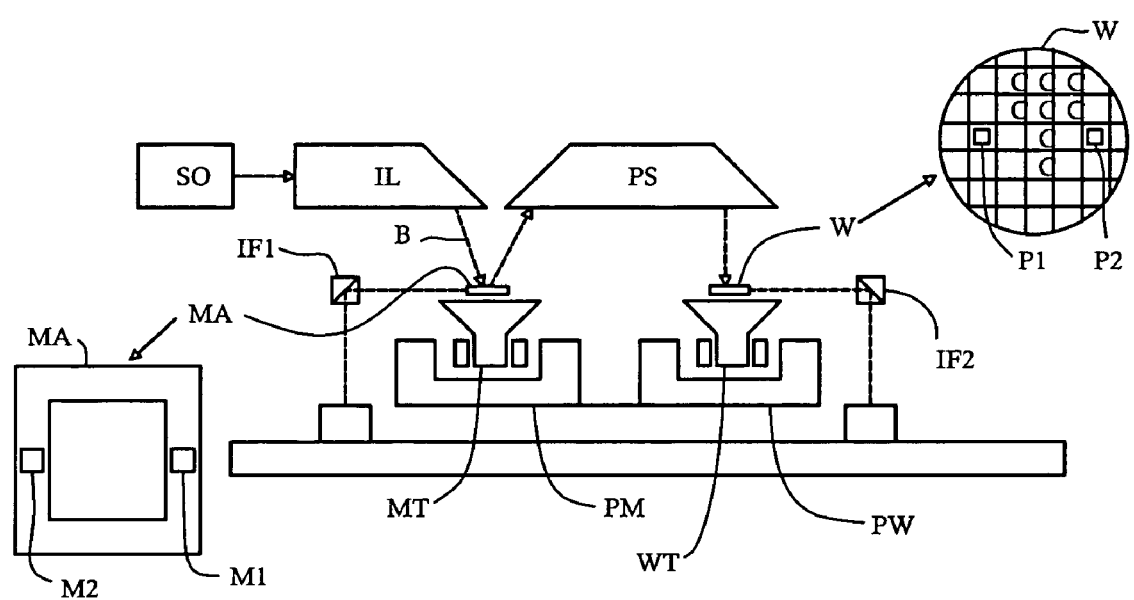
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or another type of radiation) and a support structure or patterning device support (e.g. a mask table) MT constructed to support a patterning device (e.g. a mask) MA and connected to a first positioner PM configured to accurately position the patterning device using a controller (not shown in detail) in accordance with certain parameters. The first positioner PM includes an actuator assembly which may include one or more actuators for different degrees of freedom. The apparatus also includes a substrate table or substrate support (e.g. a wafer table) WT constructed to hold a substrate (e.g. a resist-coated wafer) W and connected to a second positioner PW configured to accurately position the substrate using a controller (not shown in detail) in accordance with certain parameters. The second positioner PW includes an actuator assembly which may include one or more actuators for different degrees of freedom. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure or patterning device support can use mechanical, vacuum, electrostatic or other clamping techniques to hold the patterning device. The support structure or patterning device support may be a frame or a table, for example, which may be fixed or movable as required. The support structure or patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables or substrate supports (and/or two or more mask tables). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure or patterning device support (e.g., mask table MT), and is patterned by the patterning device. After being reflected on the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table or substrate support WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table or patterning device support MT may be realized with the aid of a long-stroke module (coarse positioning) and a short-stroke module (fine positioning), which form part of the first positioner PM. Similarly, movement of the substrate table or substrate support WT may be realized using a long-stroke module and a short-stroke module, which form part of the second positioner PW. In the case of a stepper (as opposed to a scanner) the mask table or patterning device support MT may be connected to a short-stroke actuator only, or may be fixed. Embodiments of the present invention may be applied to a controller for the first positioner PM and/or the second positioner PW.

Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. Step mode: the mask table or patterning device support MT and the substrate table or substrate support WT are kept essentially stationary, while an entire pattern imparted to the radiation beam is projected onto a target portion C at once (i.e. a single static exposure). The substrate table or substrate support WT is then shifted in the X and/or Y direction so that a different target portion C can be exposed. In step mode, the maximum size of the exposure field limits the size of the target portion C imaged in a single static exposure.

2. Scan mode: the mask table or patterning device support MT and the substrate table or substrate support WT are scanned synchronously while a pattern imparted to the radiation beam is projected onto a target portion C (i.e. a single dynamic exposure). The velocity and direction of the substrate table or substrate support WT relative to the mask table or patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. Another mode: the mask table or patterning device support MT is kept essentially stationary holding a programmable patterning device, and the substrate table or substrate support WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
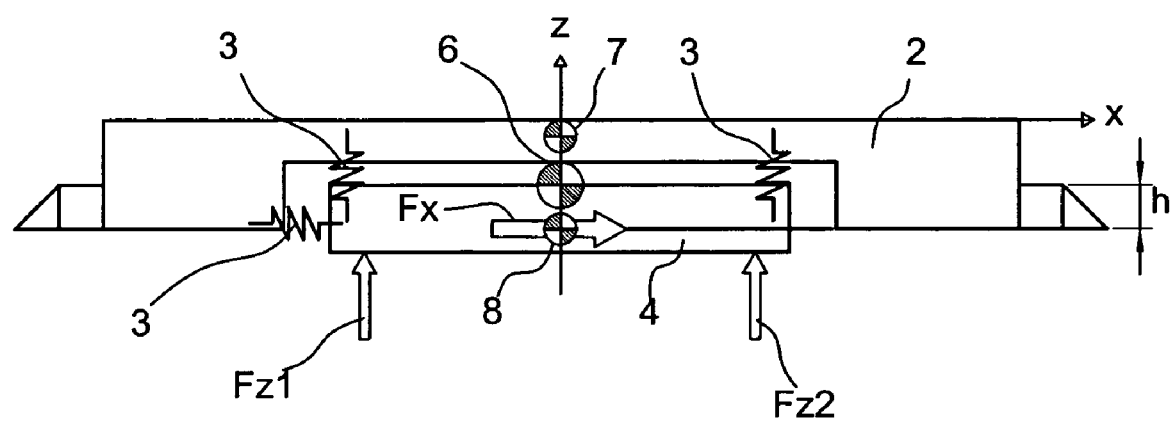
FIG. 2 schematically shows a side view of a plate-like object to be moved in a x,y direction, and an associated actuator assembly.

FIG. 2 shows an object 2 essentially extending in an x direction and an y direction, where the x direction and a z direction are indicated, and the y direction is perpendicular to the x direction and the z direction. The object 2 may be used to support a reticle or substrate in a lithographic apparatus. The object has been manufactured such as to reduce its weight as much as possible, and is thin, i.e. has a small dimension in a z direction. The object 2 is coupled via elastic connections 3 to an actuator assembly 4 for moving the object with six degrees of freedom, i.e. in an x direction, y direction, z direction, rx direction, ry direction, and rz direction. The object 2 and the actuator assembly 4 have a combined center of gravity 6 usually being different from the center of gravity 7 of the object 2 and the center 8 of the large scan force generated by the actuator assembly 4 in the x and y directions. Specifically, FIG. 2 indicates a support of the actuator assembly 4 by forces Fz1 and Fz2 acting in a z direction, a force Fx exerted by the actuator assembly 4 in the x direction, and an offset h (in a z direction) between the combined center of gravity 6 and the center of the force 8.

Figure 3:
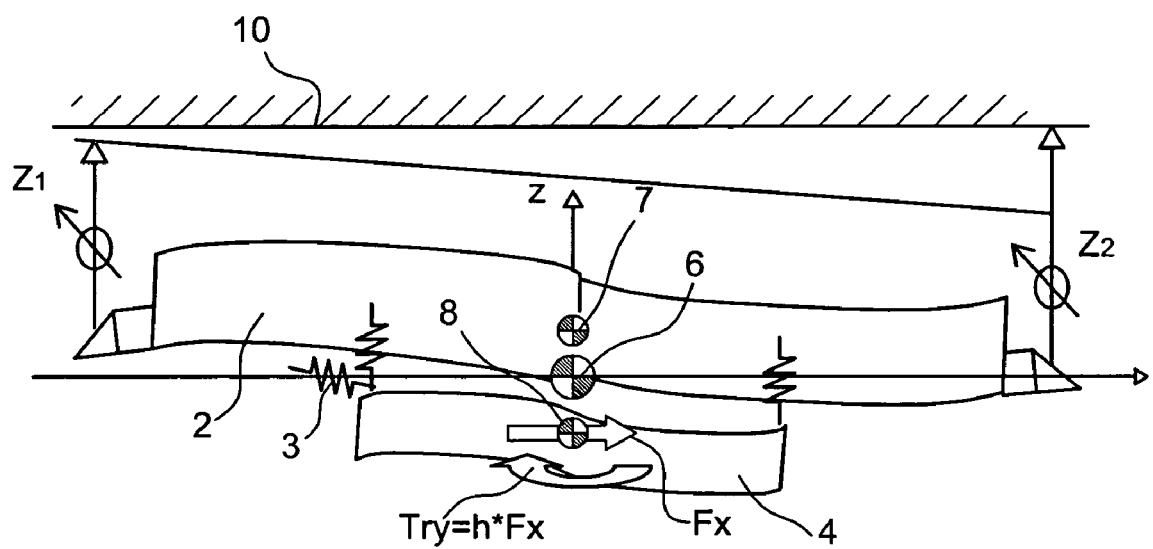
FIG. 3 schematically shows a side view of the internally elastically deformed object of FIG. 2 being accelerated by the actuator assembly in an x direction.

FIG. 3 schematically illustrates (in an exaggerated way) a deformation of the object 2 and the actuator assembly 4 under the influence of the force Fx in the x direction. As a result of the offset h (FIG. 2), during an acceleration in the x direction a torque Try in the ry direction is generated which is equal to the offset h times the horizontal force Fx:

Try=$h*Fx$ (absolute value)

The effect of the torque Try is that the common center of gravity 6 of the object will move only in the desired x direction.

FIG. 3 further indicates that a distance of the object 2 as measured in a z direction in relation to a reference plane 10 changes during the acceleration. At one end of the object 2 a distance Z1 will be measured, whereas at an opposite end of the object 2 a distance Z2 will be measured. The measurements may be performed by a laser interferometer system.

The torque Try results in a relative motion and an internal structural elastic deformation of the object 2 and the actuator assembly 4 as seen by the distance measuring system. The sign and magnitude of these effects in the ry and z directions is different for different wafer positions. As viewed from a control point of view, a mechanical crosstalk (from controller input forces to measured controller position) exists at least between the x, ry and z directions. Likewise, when an accelerating force Fy in the y direction is generated, a torque Trx is generated. Thus, with a combination of forces Fx, Fy in the x direction and y direction, respectively, a mechanical crosstalk exists at least between the x, y, rx, ry and z directions.

To prevent a rotation in the ry direction, an equal oppositely directed compensation torque is needed. It will be clear that in case of an acceleration in the y direction, a torque Trx in the rx direction is generated, which may be prevented by an equal oppositely directed compensation torque. The effect of the Trx, Try compensation forces is a dynamic internal torque in the object 2 and the actuator assembly 4 during acceleration.

Figure 4:
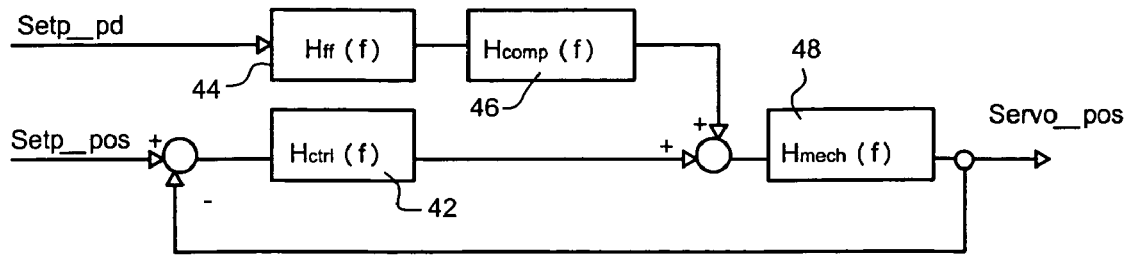
FIG. 4 shows a schematic diagram of a controller according to an embodiment of the invention including a compensator in a feedforward path of the controller.

As FIG. 4 shows, a compensator 46 may be included in a feedforward path of a controller controlling a movement of a movable part such as contained in the first positioner PM and/or the second positioner PW. The controller includes a main controller 42 having a transfer function $H_{ctrl}(f)$, a feedforward controller 44 having a transfer function $H_{ff}(f)$, the compensator 46 having a transfer function $H_{comp}(f)$ and mechanics 48 having a transfer function $H_{mech}(f)$. Position setpoint profile signals Setp_pos are compared with actual servo (actuator assembly) position signals Servo_pos and an error between the position setpoint and the servo position is input to the main controller 42. To enhance the servo performance, position-derived setpoint signals Setp_pd (like position setpoint signals, velocity setpoint signals, acceleration setpoint signals, jerk setpoint signals and/or snap setpoint signals) that are input to the feedforward controller 44 are added. If the compensator 46 is included in the feedforward path, as shown in FIG. 4, the stability of the controller is guaranteed.

Figure 5:
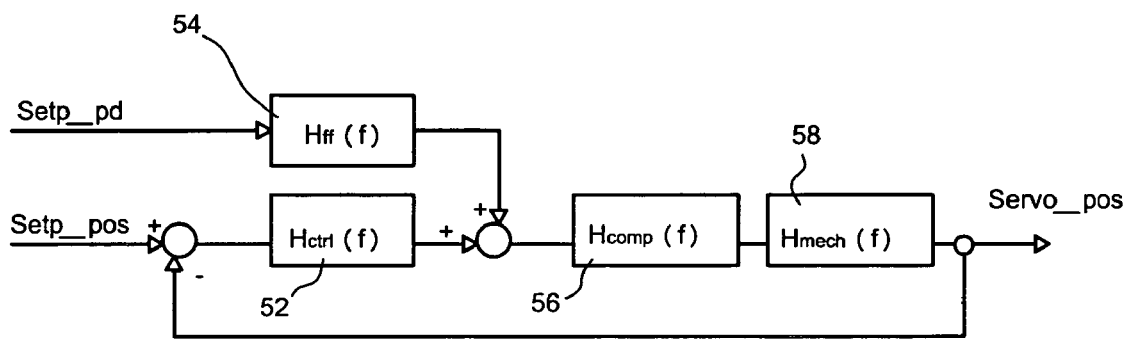
FIG. 5 shows a schematic diagram of a controller according to an embodiment of the invention including a compensator in a feedback path of the controller.

As FIG. 5 shows, a compensator 56 may be included in the feedback path of a controller, which includes a main controller 52 having a transfer function $H_{ctrl}(f)$, a feedforward controller 54 having a transfer function $H_{ff}(f)$, the compensator 56 having a transfer function $H_{comp}(f)$ and mechanics 58 having a transfer function $H_{mech}(f)$. Position setpoint profile signals Setp_pos are compared with actual servo (actuator assembly) position signals Servo_pos and an error between the position setpoint and the servo position is input to the main controller 52. To enhance the servo performance, position-derived setpoint signals Setp_pd (like position setpoint signals, velocity setpoint signals, acceleration setpoint signals, jerk setpoint signals and/or snap setpoint signals) that are input to the feedforward controller 54 are added. If the compensator 56 is included in the feedback path of the controller as shown in FIG. 5, stability issues may arise as a result of high frequencies and MIMO (Multiple Input Multiple Output) corrections in the compensator 56, as will be further elucidated below.

Figure 6:
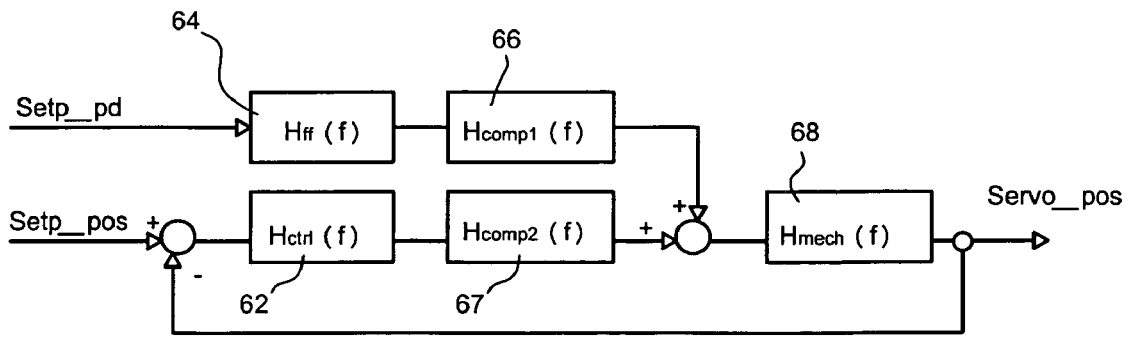
FIG. 6 shows a schematic diagram of a controller according to an embodiment of the invention including compensators in a feedforward and a feedback path of the controller.

As FIG. 6 shows, compensators 66, 67 may be included both in a feedforward and a feedback path of the controller, which includes a main controller 62 having a transfer function $H_{ctrl}(f)$, a feedforward controller 64 having a transfer function $H_{ff}(f)$, two compensators 66, 67 having respective transfer functions $H_{comp1}(f)$ and $H_{comp2}(f)$, and mechanics 68 having a transfer function $H_{mech}(f)$. Position setpoint profile signals Setp_pos are compared with actual servo (actuator assembly) position signals Servo_pos and an error between the position setpoint and the servo position is input to the main controller 62. To enhance the servo performance, position-derived setpoint signals Setp_pd (like position setpoint signals, velocity setpoint signals, acceleration setpoint signals, jerk setpoint signals and/or snap setpoint signals) that are input to the feedforward controller 64 are added. If the compensators 66, 67 are included both in the feedforward and the feedback path, as shown in FIG. 6, a maximum flexibility is obtained, but stability issues may remain.

Referring to FIG. 4, it is observed that the compensator 46 may be combined with the feedforward controller 44 to provide both control functions.

Referring to FIG. 6, it is observed that the compensators 66, 67 may be combined with the feedforward controller 64 and the main controller 62 to provide the combined control functions.

As an example, cross-talk compensation according to the invention is discussed with reference to FIG. 5. The original controller forces, which may include feedforward and feedback signals, are filtered in a frequency dependent compensator 56 having a transfer function $H_{comp}(f)$. The output of the compensator 56 is to generate compensation control forces driving the mechanics (the mechanical parts of the control system). For an operation of the compensator 56 having a transfer function $H_{comp}(f)$ resulting in a desired dynamic transfer function $H_{desired}(f)$ in six decoupled SISO (Single Input Single Output) axes, a relationship (1), written in a conventional way as a function of s (the Laplace operator), between $H_{comp}(f)$, $H_{desired}(f)$ and $H_{mech}(s)$ is as follows:

$$H_{mech}(s)*H_{comp}(s)=H_{desired}(s)$$

Hence:

$$H_{comp}(s)=[H_{mech}(s)]^{-1}*H_{desired}(s) \quad (1)$$

wherein s denotes a differentiation.

$H_{mech}(f)$ is a transfer function of input control forces to measured positions, such as an (x,y) position. The inverse of $H_{mech}(f)$ is unstable, and thus generally cannot be directly implemented.

Figure 7:
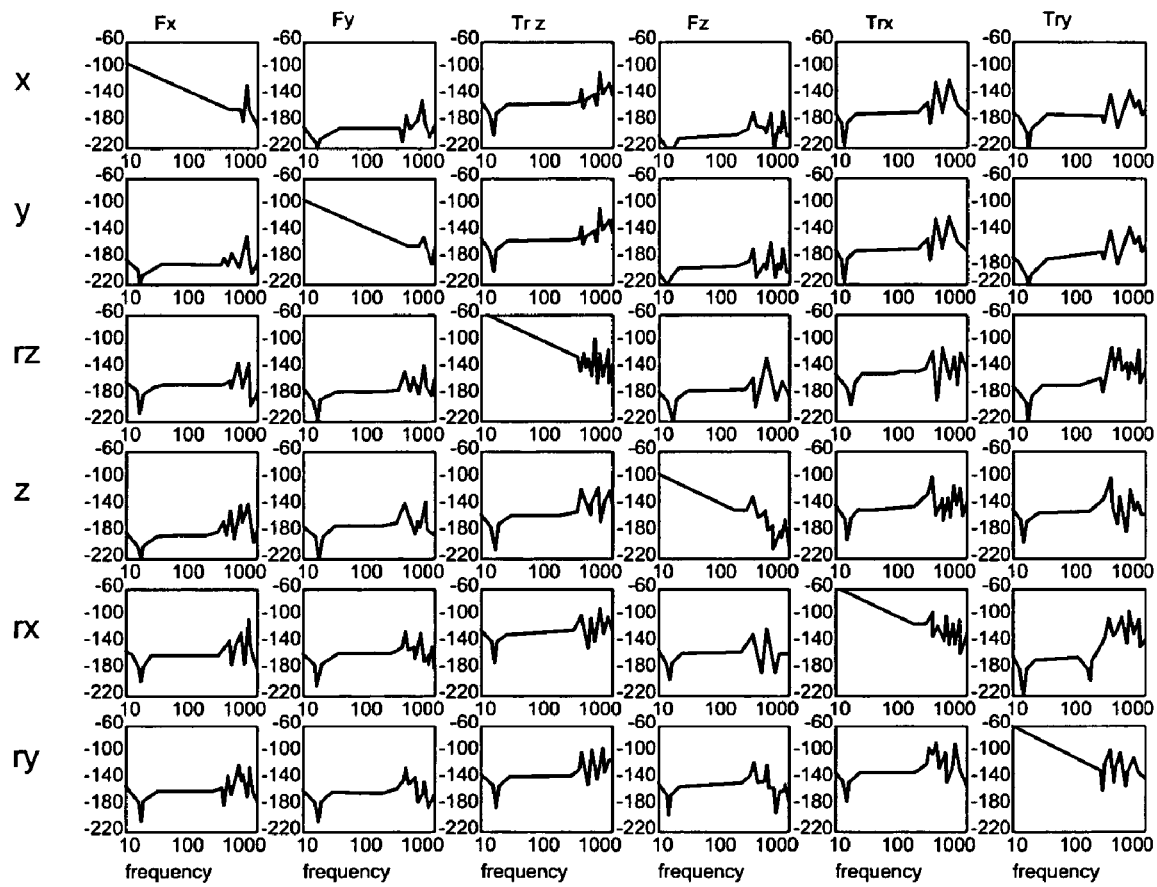
FIG. 7 symbolically illustrates a six degrees of freedom Bode plot array of the object open loop mechanics showing phase angle in degrees as a function of frequency in Hz, where the input is a control force Fx, Fy or Fz, or a control torque Trx, Try or Trz, and the output is a measured position x, y, z, rx, ry or rz.

FIG. 7 shows a six degrees of freedom MIMO Bode plot array of the mechanics transfer function $H_{mech}(f)$ without compensation. On the diagonal the different Bode plots (transfer functions of: force Fx in x direction to the x position, force Fy in y direction to the y position, torque Trz in rz direction to the rz position, force Fz in z direction to the z position, torque Trx in rx direction to the rx position, and torque Try in ry direction to the ry position, respectively) show mass/inertia lines characterized by a −40 dB/decade roll off and a −180 degrees phase shift. At high frequencies, here generally from 600-1200 Hz, some additional mechanical resonances are found. The diagonal Bode plots form the open loop mechanics (from force to position) to be controlled by the SISO servo controllers.

The non-diagonal terms or cross-talk terms, such as the transfer function of Fx to the y position or Fx to the z position, show substantially horizontal lines with 0 dB/decade. These lines represent the internal stiffness of the object to be moved. If, for example, an Fx is applied, the displacement in the z direction (z position) is proportional to this force over a lower frequency region, here generally from 10-500 Hz. At very low frequencies, here generally below 10 Hz, some zeros (seen as "notches" in the Bode plot) can be observed.

Figure 8:
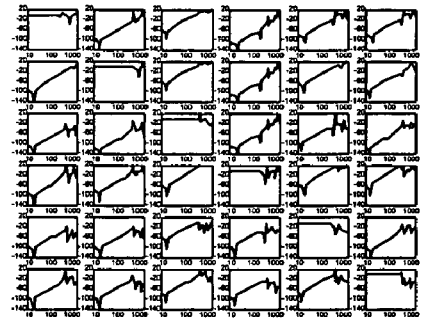
FIG. 8 symbolically illustrates a calculation of a frequency dependent compensation Bode plot array of transfer functions $H_{comp}(f)$.
Figure 8:
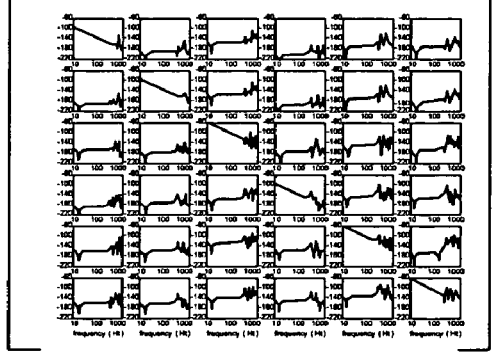
Figure 8:
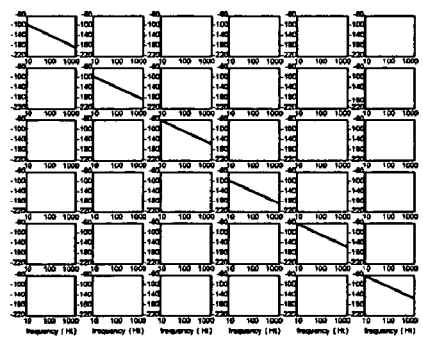

FIG. 8 shows a graphical Bode plot array representation of the compensator transfer function design in accordance with relationship (1) above. After compensation, the result should be that the overall transfer function $H_{desired}(f)$ has only six decoupled SISO axes with the crosstalk off-diagonal terms all being zero. In other words, the actuator assembly dynamics should be dynamically decoupled.

Figure 9:
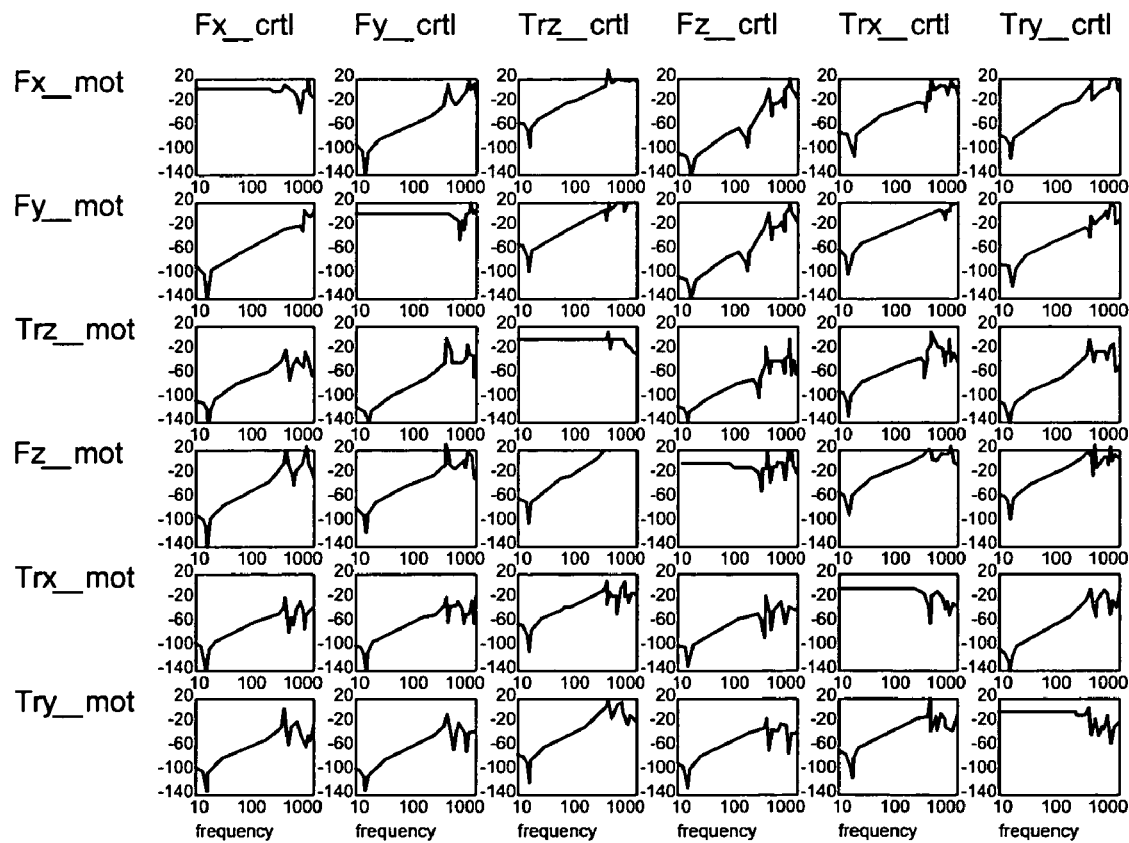
FIG. 9 illustrates the Bode plot array of transfer functions $H_{comp}(f)$ in more detail.

To obtain this result, it is desirable to implement the compensator $H_{comp}(f)$ of FIG. 9. This represents a six degrees of freedom MIMO (Multiple In Multiple Out) system formed by 36 filters (on the diagonal, the following transfer functions are depicted: control force Fx_ctrl in x direction to motor force Fx_mot in x direction, control force Fy_ctrl in y direction to motor force Fy_mot in y direction, control torque Trz_ctrl in rz direction to motor torque Trz_mot in rz direction, control force Fz_ctrl in z direction to motor force Fz_mot in z direction, control torque Trx_ctrl in rx direction to motor torque Trx_mot in rx direction, and control torque Try_ctrl in ry direction to motor torque Try_mot in ry direction). It is observed here that a motor torque (force in rotational direction) may be generated by combining translation forces. If the position sensors measure different parts of a support table as a function of the substrate position, these filters all have a (x,y) position dependent gain. The diagonal terms here all generally have a unity gain (+0 dB/decade gain), and thus the main diagonal forces only need a compensation at high frequency (near the dominant resonance). In an embodiment, this may be done by a $4^{th}$ order feedforward filter or snap (derivative of jerk) feedforward.

The off-diagonal terms in FIG. 9 all show a +40 dB/decade gain, with resonances at very high frequencies. Over a large frequency range, generally from 1-500 Hz, these filters can be approximated by $2^{nd}$ order highpass filters in series with a (x,y) position dependent gain.

For an implementation, a number of suitable options are possible, comprising:

(1) fitting all 36 (x,y) position dependent transfer functions, with all significant modes, by stabilized filters (implemented as a numerator denominator polynomial in the z-domain, or as a State Space Description in the z-domain); or (2) approximating all 6 position dependent diagonal terms by a unity gain, and approximating all 30 position dependent off-diagonal terms by $2^{nd}$ order high pass filters with a position dependent gain. In this case, if the compensator is included in a feedback path of the controller, the compensator may have a control function according to an array of Bode plots descriptive of transfer functions coupling a plurality of controller force inputs and controller torque inputs to a plurality of output motor feedback forces and output motor feedback torques. In particular, the compensator may have a control function according to an array of Bode plots descriptive of transfer functions of, on the one hand, controller force input in x direction, controller force input in y direction, controller torque input in rz direction, controller force input in z direction, controller torque input in rx direction, and controller torque input in ry direction to any of, on the other hand, output motor feedback force in x direction, output motor feedback force in y direction, output motor feedback torque in rz direction, output motor feedback force in z direction, output motor feedback torque in rx direction, and output motor feedback torque in ry direction. If the compensator is included in a feedforward path of the controller, the compensator may have a control function according to an array of Bode plots descriptive of transfer functions coupling a plurality of controller setpoint position-derived force inputs and controller setpoint position-derived torque inputs to a plurality of output motor feedforward forces and output motor feedforward torques. In particular, the compensator may have a control function according to an array of Bode plots descriptive of transfer functions of, on the one hand, controller setpoint position-derived force input in x direction, controller setpoint position-derived force input in y direction, controller setpoint position-derived torque input in rz direction, controller setpoint position-derived force input in z direction, controller setpoint position derived torque input in rx direction, and controller setpoint position-derived torque input in ry direction to any of, on the other hand, output motor feedforward force in x direction, output motor feedforward force in y direction, output motor feedforward torque in rz direction, output motor feedforward force in z direction, output motor feedforward torque in rx direction, and output motor feedforward torque in ry direction;

(3) implementing only a subset of option (2), namely all 6 position dependent diagonal terms and 10 position dependent off-diagonal terms which have as an input the large scan forces Fx, Fy and as an output the measured positions in the x, y, Rz, z, Rx and Ry directions. In this case, if the compensator is included in a feedback path of the controller, the compensator may have a control function according to an array of Bode plots descriptive of transfer functions of, on the one hand, controller force input in x direction, and controller force input in y direction, to any of, on the other hand, output motor feedback force in x direction, output motor feedback force in y direction, output motor feedback torque in rz direction, output motor feedback force in z direction, output motor feedback torque in rx direction, and output motor feedback torque in ry direction. If the compensator is included in a feedforward path of the controller, the compensator may have a control function according to an array of Bode plots descriptive of transfer functions of, on the one hand, controller setpoint position-derived force input in x direction, and controller setpoint position-derived force input in y direction, to any of, on the other hand, output motor feedforward force in x direction, output motor feedforward force in y direction, output motor feedforward torque in rz direction, output motor feedforward force in z direction, output motor feedforward torque in rx direction, and output motor feedforward torque in ry direction.

In the following, a procedure according to option 3 will be described by way of example, comprising:

(a) defining a transfer function $H_{desired}(f)$ as a six degrees of freedom transfer function (with real and imaginary parts as a function of frequency) as a six degrees of freedom system with ideal rigid body diagonal mass/inertia mechanics;

(b) measuring $H_{mech}(f)$ as a six degrees of freedom transfer function (with real and imaginary parts as a function of frequency) over a large frequency range, from a minimum frequency fmin (e.g. fmin=1 Hz) up to a maximum frequency fmax (e.g. fmax=0.5* fsample=2.5 kHz);

(c) inverting the complex matrix $H_{mech}(f)$ to obtain inv $(H_{mech}(f))$;

(d) calculating $H_{comp}(f)$ by a complex multiplication: $H_{comp}(f)=inv(H_{mech}(f))* H_{desired}(f)$;

(e) integrating $H_{comp}(f)$ twice (for an easy fitting of the high pass gains and for noise reduction) to obtain $H_{comp\_int2}(f)$: $H_{comp\_int2}(f)=H_{comp}(f)/(2*\pi*f)^2$;

(f) fitting gains by taking the mean value of the real part of the six degrees of freedom transfer: $K=mean(real(H_{comp\_int2}(fmin \ldots fmax)))$ and replacing the diagonal terms by a unity gain;

(g) repeating steps (a)-(f) for at least 9 K(x,y) positions: (x,y)=(0,0), (xmax,0), (xmax,ymax), (0,ymax), (xmin,ymax), (xmin,0), (xmin,ymin), (0,ymin) and (xmax,ymin);

(h) calculating the actual value of K(x,y) for a certain (x,y) setpoint position by interpolating between two other points, using the results from (g);

(i) adding these K(x,y) gains to high pass filters which apply setpoint accelerations to correct forces.

With the motion system as described above, a horizontal to vertical cross-talk may be eliminated, thereby improving the MA/MSD accuracy in z, rx and ry directions and shorting the settling time of the control system. Likewise, the vertical to horizontal cross-talk may be eliminated, thereby improving the MA/MSD accuracy in x, y and rz directions and shortening the settling time of the control system. As a result of the short settling time, an increased throughput of the lithographic apparatus may be obtained. Further, the dynamical or mechanical requirements on the movable object may be relaxed, resulting in a cost of goods saving.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a patterning device support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate,
   an actuator assembly configured to move one of said supports with six degrees of freedom comprising x, y, z, rx, ry and rz directions, and
   a controller configured to control said actuator assembly, the controller comprising at least one compensator configured to dynamically decouple dynamics of said actuator assembly in said degrees of freedom.

2. The lithographic apparatus of claim 1, wherein the compensator has a control function obtained by multiplication of a plurality of desired transfer functions to dynamically decouple the actuator assembly's dynamics, and a plurality of inverted transfer functions of a mechanical behavior of a combination of the actuator assembly and said one support.

3. The lithographic apparatus of claim 1, wherein the compensator is included in a feedback path of the controller.

4. The lithographic apparatus of claim 3, wherein the compensator has a control function according to an array of Bode plots descriptive of transfer functions coupling a plurality of controller force inputs and controller torque inputs to a plurality of output motor feedback forces and output motor feedback torques.

5. The lithographic apparatus of claim 4, wherein the compensator has a control function according to an array of Bode plots descriptive of transfer functions of, on the one hand, controller force input in x direction, controller force input in y direction, controller torque input in rz direction, controller force input in z direction, controller torque input in rx direction, and controller torque input in ry direction to any of, on the other hand, output motor feedback force in x direction, output motor feedback force in y direction, output motor feedback torque in rz direction, output motor feedback force in z direction, output motor feedback torque in rx direction, and output motor feedback torque in ry direction.

6. The lithographic apparatus of claim 4, wherein the compensator has a control function according to an array of Bode plots descriptive of transfer functions of, on the one hand, controller force input in x direction, and controller force input in y direction, to any of, on the other hand, output motor feedback force in x direction, output motor feedback force in y direction, output motor feedback torque in rz direction, output motor feedback force in z direction, output motor feedback torque in rx direction, and output motor feedback torque in ry direction.

7. The lithographic apparatus of claim 4, wherein the array of Bode plots contains diagonal terms having a constant gain over a frequency range, and off-diagonal terms having about a +40 dB/decade gain over a frequency range.

8. The lithographic apparatus of claim 7, wherein the off-diagonal terms are approximated by 2nd order highpass filters in series with a position dependent gain.

9. The lithographic apparatus of claim 4, wherein the terms of the array of Bode plots are fitted by stabilized filters.

10. The lithographic apparatus of claim 9, wherein the stabilized filters are implemented as a numerator denominator polynomial in the z-domain.

11. The lithographic apparatus of claim 9, wherein the stabilized filters are implemented as a State Space Description in the z-domain.

12. The lithographic apparatus of claim 1, wherein the compensator is included in a feedforward path of the controller.

13. The lithographic apparatus of claim 12, wherein the compensator has a control function according to an array of Bode plots descriptive of transfer functions coupling a plurality of controller setpoint position-derived force inputs and controller setpoint position-derived torque inputs to a plurality of output motor feedforward forces and output motor feedforward torques.

14. The lithographic apparatus of claim 13, wherein the compensator has a control function according to an array of Bode plots descriptive of transfer functions of, on the one hand, controller setpoint position-derived force input in x direction, controller setpoint position-derived force input in y direction, controller setpoint position-derived torque input in rz direction, controller setpoint position-derived force input in z direction, controller setpoint position derived torque input in rx direction, and controller setpoint position-derived torque input in ry direction to any of, on the other hand, output motor feedforward force in x direction, output motor feedforward force in y direction, output motor feedforward torque in rz direction, output motor feedforward force in z direction, output motor feedforward torque in rx direction, and output motor feedforward torque in ry direction.

15. The lithographic apparatus of claim 13, wherein the compensator has a control function according to an array of Bode plots descriptive of transfer functions of, on the one hand, controller setpoint position-derived force input in x direction, and controller setpoint position-derived force input in y direction, to any of, on the other hand, output motor feedforward force in x direction, output motor feedforward force in y direction, output motor feedforward torque in rz direction, output motor feedforward force in z direction, output motor feedforward torque in rx direction, and output motor feedforward torque in ry direction.

16. The lithographic apparatus of claim 13, wherein the array of Bode plots contains diagonal terms having a constant gain over a frequency range, and off-diagonal terms having about a +40 dB/decade gain over a frequency range.

17. The lithographic apparatus of claim 16, wherein the off-diagonal terms are approximated by 2nd order highpass filters in series with a position dependent gain.

18. The lithographic apparatus of claim 13, wherein the terms of the array of Bode plots are fitted by stabilized filters.

19. The lithographic apparatus of claim 18, wherein the stabilized filters are implemented as a numerator denominator polynomial in the z-domain.

20. The lithographic apparatus of claim 18, wherein the stabilized filters are implemented as a State Space Description in the z-domain.

21. The lithographic apparatus of claim 1, wherein said one support is the patterning device support.

22. The lithographic apparatus of claim 1, wherein said one support is the substrate support.

23. The lithographic apparatus of claim 1, further comprising an additional actuator assembly configured to move the other one of said supports such that both said patterning device support and said substrate support are moved by an actuator assembly, with six degrees of freedom comprising x, y, z, rx, ry and rz directions, that is controlled by a respective controller comprising at least one compensator configured to dynamically decouple a dynamics of the actuator assembly in said degrees of freedom.

24. The lithographic apparatus of claim 1, wherein said actuator assembly's dynamics are decoupled in said degrees of freedom.

25. A device manufacturing method comprising:
patterning a beam of radiation with a patterning device to form a patterned beam of radiation, the patterning device being supported by a patterning device support;
projecting the patterned radiation beam onto a target portion of a substrate, the substrate being supported by a substrate support,
moving one of said supports with an actuator assembly, said actuator assembly being configured to move said one support with six degrees of freedom comprising x, y, z, rx, ry and rz directions, and
controlling said actuator assembly by dynamically decoupling dynamics of the actuator assembly in said degrees of freedom.

26. The device manufacturing method of claim 25, wherein said actuator assembly is controlled by a control function obtained by multiplication of a plurality of desired transfer functions to dynamically decouple the actuator assembly's dynamics, and a plurality of inverted transfer functions of a mechanical behavior of the actuator assembly and said one support.

27. The device manufacturing method of claim 25, further comprising moving the other of said supports with another actuator assembly, said another actuator assembly being configured to move the other support with six degrees of freedom, wherein said another actuator assembly is dynamically decoupled in said six degrees of freedom.

* * * * *